United States Patent
Yokose (10) Patent No.: US 6,717,534 B2
(45) Date of Patent: Apr. 6, 2004

(54) DATA ENCODING DEVICE AND DATA DECODING DEVICE

(75) Inventor: Taro Yokose, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/342,204

(22) Filed: Jan. 15, 2003

(65) Prior Publication Data

US 2003/0137438 A1 Jul. 24, 2003

(30) Foreign Application Priority Data

Jan. 18, 2002 (JP) .................................... 2002-010179

(51) Int. Cl.[7] ............................................. H03M 7/40
(52) U.S. Cl. ......................................... 341/65; 341/50
(58) Field of Search ............................ 341/50, 67, 65, 341/63; 714/701; 704/223

(56) References Cited

U.S. PATENT DOCUMENTS 5,657,420 A * 8/1997 Jacobs et al. ............... 704/223
5,944,843 A * 8/1999 Sharma et al. .............. 714/701
6,441,755 B1 * 8/2002 Dietz et al. .................. 341/50

OTHER PUBLICATIONS

The Data Compression Book, Second Edition, By Mark Nelson/ Jean–Loup Gailly, 1996 by M&T Books (translated by Takeshi Ogihara and Suguru Yamaguchi, published by K.K. Toppan, in Mar. 1996).

* cited by examiner

*Primary Examiner*—Jean JeanGlaude
(74) *Attorney, Agent, or Firm*—Morgan, Lewis & Bockius LLP (57) ABSTRACT

A data encoding device and a data decoding device. A data encoding device refers to first and second encoding tables to search for a code word correlated with encoding data. One of the code words is selected according to predetermined criteria. When the selected code word requires additional information, additional information is generated. A data decoding device refers to the first and second encoding tables and retrieves a data element from at least one of the tables. When additional information is available, original data is calculated based on the data element and the additional information. When additional information is not available, the retrieved data element is output without modification as original data.

18 Claims, 5 Drawing Sheets

FIG. 1

| DATA ELEMENT | CODE WORD | BIT NUMBER OF ADDITIONAL INFORMATION |
|---|---|---|
| n~n+7 | xx | 3 |
| --- | --- | --- |
| n+4 | yy | 0 |
| n+7 | zzzzz | 0 |
| --- | --- | --- |

First encoding table: rows n~n+7 and ---
Second encoding table: rows n+4, n+7, and ---

DATA ENCODING DEVICE AND DATA DECODING DEVICE

BACKGROUND OF THE INVENTION

1. Field of the Invention

The present invention relates to a data encoding device and a data decoding device.

2. Description of the Related Art

Basic technical concept for data compression may be embodied in Huffman encoding. In Huffman encoding, a letter with large occurrence frequency is assigned a shorter bit-length code. That is, respective letters are assigned individually recognizable codes such that a letter which occurs less frequently is assigned a longer bit-length code. This basic encoding method is described in detail in "The Data Compression Book, Second Edition" (written by M. Nelson, Jean-LoupGailly, translated by Takeshi Ogihara and Suguru Yamaguchi, published by K. K. Toppan, in March 1996) and is not described here.

In Huffman encoding, the data element (a unit for encoding) to code word (the minimum code unit) ratio is 1:1. That is, one data element correlates to one code word, and one code word correlates to one data element. When employing such an encoding method, correlation between a data element and a code word is generally defined in an encoding table.

In encoding utilizing an encoding table, assignment of code words to data elements can be achieved without much trouble when each encoding data in a series of encoding data is covered by a group of the relatively small number of kinds of data elements. However, for a case wherein a relatively large number of types of data elements are necessary to cover a series of encoding data, the assignment may not be easily achieved because any increase in the number of involved data elements leads to an increase of the number of code words which must be assigned, which in turn results in an enlarging the encoding table. For example, the encoding of twenty-six English alphabets (data elements) requires an encoding table which defines twenty-six code words, while encoding fifty Japanese syllabary characters requires an encoding table which defines fifty code words.

Increasing the number of code words also increases the amount of time and effort required to create a compatible encoding table, and the resulting encoding table will be relatively more difficult to install. Moreover, in an encoding method in which an encoding table is attached to encoded data, an enlarged encoding table may adversely affect the data compression rate.

In light of the above, in order to reduce the size of an encoding table without adversely affecting a compression rate, additional bit technology has conventionally been employed in the standard method promoted by the Joint Photographic Experts Group, or JPEG, which is an international standard image encoding method. In the following, an additional bit technology will be described, while referring to JPEG as an example.

Briefly, JPEG is a technology for compressing data by removing high frequency components in spatial frequency components of a pixel value in image data, such as photographs, and relies on the fact that there is only a small difference in a pixel value between adjacent pixels. During a process of compression, image data is segmented into image blocks each consisting of 8×8 pixels, for example, and frequency components in each image block are subjected to discrete cosine transformation, or DCT, to divide them into DC and AC components.

For DC components, a difference between adjacent image blocks is subjected to Huffman encoding. In Huffman encoding, difference values of DC components are put into groups before encoding. That is, a group of difference values is treated as a data element, or a unit of data encoding, and an encoding table defining correlation between each group and a code word is used in Huffman encoding.

Further, for accurate description of a difference value of each DC component (a current difference value), a difference between a current difference value and the minimum difference value (a group minimum value) which is assigned to the concerned group is added as an additional bit to a Huffman code word. The additional bit may be calculated as follows:

For current difference value smaller than 0 ( < 0)

(additional bit) = (current difference value) − (group minimum value)

For current difference value equal to or larger than 0 ( ≧ 0)

(additional bit) =

(current difference value) + (group minimum value)  + M − 1 wherein M is the number of types of data present in the group. This calculation, however, is theoretical. In actuality, a simplified version utilizing the characteristics of an encoding table is used.

In decoding, an encoding table which was referred to in encoding is again referred to in order to specify a relevant group based on a Huffman code word. Then, a difference value of the original DC component is obtained based on the group minimum value of the identified group and the additional bit.

As described above, according to an example of a conventional encoding technology, an encoding table using data groups and additional information (additional bit) for specifying particular data in a data group are utilized to ensure a smaller encoding table.

However, although the above-described conventional encoding technology which utilizes an encoding table using data groups and additional information can improve compression efficiency when occurrence frequencies of the respective data which constitute a group are substantially constant, the technology faces a difficulty when occurrence frequencies of the data are not constant. Problems often arise because improvement of compression efficiency in the latter case requires enlarging the size of the encoding table, and an enlarged coding table is more difficult to install.

In short, in a technology such as JPEG, in which values are grouped, even when it may be possible to handle situations wherein successive values are put into a single group, a situation wherein discrete values are placed in one group may face difficulty. That is, because it is expected in JPEG that a difference value of each DC component will be substantially zero, based on the assumption that a difference in pixel values of adjacent pixels is small, values which are closer to zero may have larger occurrence frequencies, and therefore should be assigned a shorter code word. In such a case, grouping may be possible such that values equal to or smaller than 3 be assigned the shortest code word. However, should values "0.8 to 1.2" have smaller frequency, the values may better e grouped into "0 to 0.8", "0.8 to 1.2", and "1.2 to 3" to attain h compression efficiency.

That is, presence of a peculiar value range, such as a value range without successiveness in terms of occurrence frequency or with difficulty in estimation of occurrence frequency, results in a need for increasing the number of data groups and thus entries to an encoding table. Creation and installation of such an enlarged encoding table are difficult to achieve.

SUMMARY OF THE INVENTION

The present invention was conceived in view of the above, and the present invention therefore advantageously provides an improved data encoding device and an improved data decoding device.

According to one aspect of the present invention, there is provided a data encoding device, comprising an encoding table for correlating a data element with a code word such that one data element is correlated with N number of code words and one code word is correlated with one data element, the data element serving as a unit of data encoding, N being an integer larger than zero; a retrieve unit for determining a data element corresponding to each of a series of encoding data and for retrieving the N number of code words correlated with the determined data element with reference to the encoding table; a selector for selecting one code word from among the N number of code words according to predetermined criteria; and a generator for generating, as required, additional information which specifies encoding data correlated with the selected code word among one or more encoding data corresponding to the determined data element correlated with the selected code word, whereby each encoding data is converted into either additional information attached encoded data or normal encoded data, the additional information attached encoded data consisting of a code word and additional information, the normal encoded data consisting of a code word.

According to another aspect of the present invention, there is provided a data encoding device, comprising encoding tables each for correlating one data element with one code word, the data element serving as a unit of data encoding; a retrieve unit for determining a data element corresponding to each of a series of encoding data and for retrieving N number of encoding tables which each define a code word correlated with the determined data element, N being an integer larger than zero; a selector for selecting one encoding table from among the N number of encoding tables according to predetermined criteria to output a code word which is defined by the selected encoding table as correlated with the determined data element; a generator for generating, as required, additional information which specifies encoding data correlated with the selected code word among one or more encoding data corresponding to the determined data element correlated with the selected code word, whereby each encoding data is converted into either additional information attached encoded data or normal encoded data, the additional information attached encoded data consisting of a code word and additional information, the normal encoded data consisting of a code word.

In the above, the predetermined condition may define such that selection means selects the shortest code word among the N number or code word or one code word according to a predetermined priority order.

It is preferable, when selecting one encoding table from among two or more encoding tables, that the selection means outputs selection information which specifies the selected encoding data, for correlation with each code word.

According to still another aspect of the present invention, there is provided a data decoding device, comprising an encoding table for correlating a data element with a code word such that one data element is correlated with N number of code words and one code word is correlated with one data element, the data element serving as a unit of data encoding, N being an integer larger than zero; a retrieve unit for sequentially extracting encoded data from a series of encoded data obtained by a data encoding device and for retrieving a data element correlated with a code word contained in the extracted encoded data with reference to the encoding table; and a decoder for decoding, when the extracted encoded data is additional information attached encoded data, additional information based on the retrieved data element and the extracted additional information.

According to yet aspect of the present invention, there is provided a data decoding device, comprising encoding tables each for correlating one data element with a code word, the data element serving as a unit of data encoding; a retrieve unit for sequentially extracting encoded data from a series of encoded data obtained by a data encoding device which comprises the encoding tables, and for retrieving a data element correlated with a code word contained in the extracted encoded data with reference to the encoding table; and a decoder for decoding, when the extracted encoded data is additional information attached encoded data, additional information based on the retrieved data element and the extracted additional information.

According to yet aspect of the present invention, there is provided a data decoding device, comprising encoding tables each for correlating one data element with a code word, the data element serving as a unit of data encoding; a retrieve unit for sequentially extracting encoded data from a series of encoded data obtained by a data encoding device which comprises the encoding tables and outputs selection information concerning the selected encoding table, to extract a code word contained in the extracted encoded data, for selecting one encoding table from among the encoding tables based on selection information which is correlated with the extracted code word, and for retrieving a data element correlated with the extracted code word with reference to the selected encoding table; and decoder for decoding, when the extracted encoded data is additional information attached encoded data, additional information based on the determined data element and the extracted additional information.

According to yet aspect of the present invention, there is provided a data encoding method employing an encoding table which correlates a data element with code word such that one data element is correlated with N number of code words and one code word is correlated with one data element, the data element serving as a unit of data encoding, N being an integer larger than zero; the method comprising a search step of determining a data element corresponding to each of a series of encoding data to determine the N number of code words correlated with the determined data element with reference to the encoding table; a selection step of selecting one code word from among the N number of code words according to a predetermined criteria; and a generation step of generating, as required, additional information which specifies encoding data correlated with the selected code word among one or more encoding data corresponding to the determined data element correlated with the selected code word, whereby each encoding data is converted into either additional information attached encoded data or normal encoded data, the additional information attached encoded data consisting of a code word and additional information, the normal encoded data consisting of a code word.

According to yet aspect of the present invention, there is provided encoded data generated by the above-described data encoding method.

According to yet aspect of the present invention, there is provided a data decoding method employing a table which correlates a data element with a code word such that one data element is correlated with N number of code words and one code word is correlated with one data element, the data element serving as a unit of data encoding, N being an integer larger than zero, the method, comprising: a search step of sequentially extracting encoded data from a series of encoded data obtained by a data encoding device and determining a data element correlated with a code word contained in the extracted encoded data with reference to the table; and a decoding step of decoding, when the extracted encoded data is additional information attached encoded data, additional information based on the determined data element and the extracted additional information.

According to yet aspect of the present invention, there is provided encoded data generated by encoding a series of encoding data, including additional information attached encoded data and normal encoded data, the additional information attached encoded data consisting of a code word and additional information and the word data consisting of a code word.

According to yet aspect of the present invention, there is provided encoded data, generated using two or more encoding tables which respectively correlate one data element with different code words, the data element serving as a unit of data encoding, as the product of a search step of determining a data element corresponding to each of a series of encoding data and determining N number of encoding tables which each define a code word correlated with the determined data element, N being an integer larger than zero; a selection step of selecting one encoding table from among the N number of encoding tables according to a predetermined criteria to output a code word correlated with the determined data element according to the selected encoding table; a generation step of generating, as required, additional information which specifies encoding data correlated with the selected code word among one or more encoding data corresponding to the determined data element correlated with the selected code word, to thereby convert each encoding data into either additional information attached encoded data or normal encoded data, the additional information attached encoded data consisting of a code word and additional information, the normal encoded data consisting of a code word, wherein the encoded data contains at least one additional information attached encoded data and one normal encoded data according to the series of encoding data.

According to yet aspect of the present invention, there is provided encoded data according to claim 15, further containing information specifying an encoding table which is selected when outputting each code word.

DESCRIPTION OF THE PREFERRED EMBODIMENT

A preferred embodiment of the present invention will be described with reference to the accompanied drawings.

First, the principle behind the encoding processing employed in a data encoding device and a data decoding device in this embodiment will be described.

According to the present invention, the interpretation of the technical concept of one-to-one encoding, that one code word correlates with one encoding data element as embodied in conventional Huffman encoding, is stretched such that N (N being an integer larger than 0) code words are correlated with one encoding data element. To adopt this interpretation, it must be arranged that one data element can be determined relative to one code word to avoid adversely effecting decoding.

Assignment of two or more code words to one data element as described above makes it possible to define two types of correlation, including successive code words using additional information and a specific code word, relative to one data element. As a result, a compact encoding table and high compression efficiency can be simultaneously realized by utilizing additional information and by assigning detailed code words, respectively.

Figure 1:
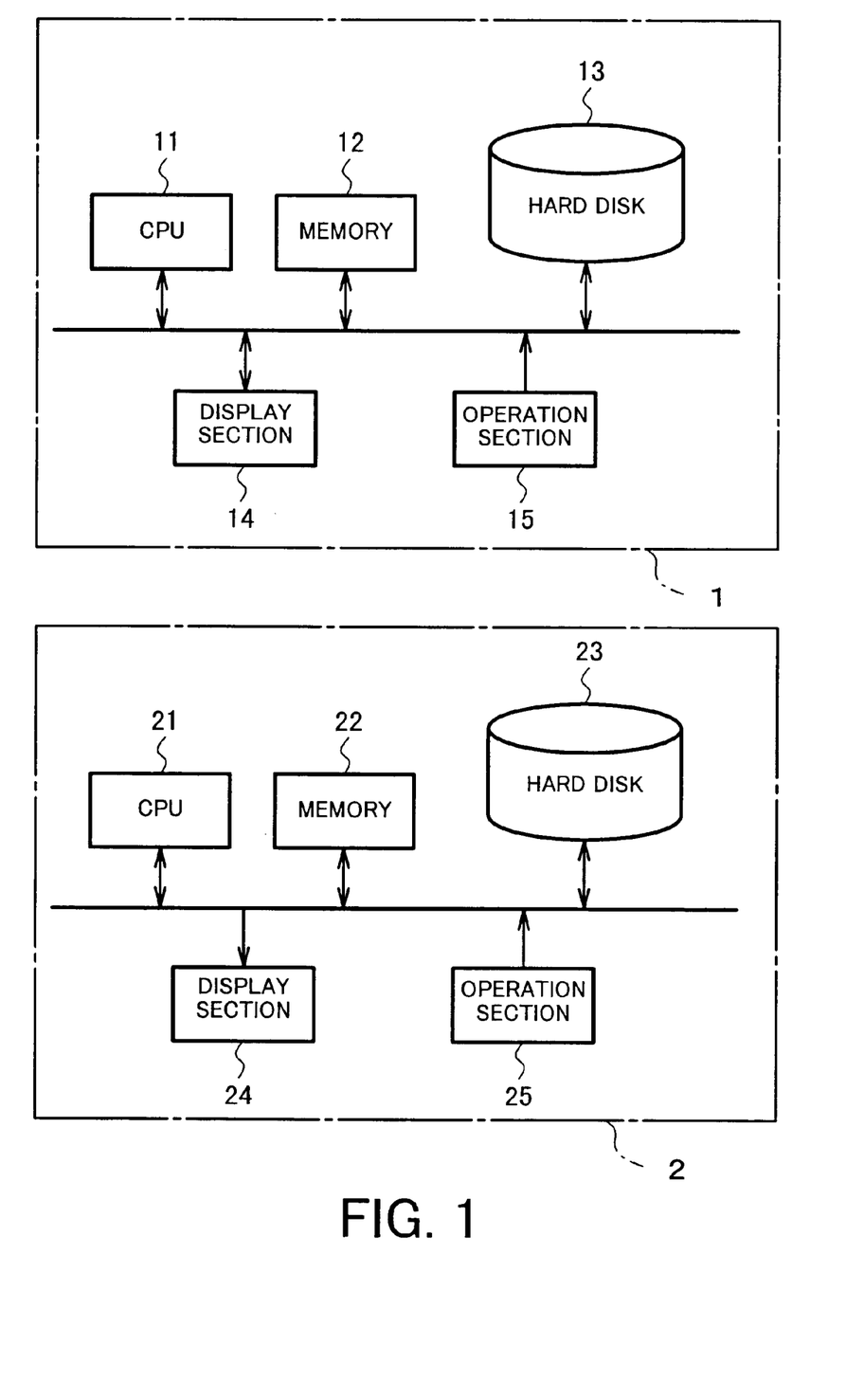
FIG. 1 is a block diagram showing a structure of a data processing system in an embodiment according to the present invention.

A data processing system in this embodiment comprises a data encoding device 1 and a data decoding device 2, as shown in FIG. 1, both being general personal computers. The data encoding device 1 comprises a CPU 11, a memory 12, a hard disk 13, a display section 14, and an operation section 15, all mutually connected via a bus. The data decoding device 2 comprises a CPU 21, a memory 22, a hard disk 23, a display section 24, and an operation section 25, all mutually connected via a bus. It should be noted that, although to simplify description the data encoding device 1 and the data decoding device 2 are described here as being separate entities, these may be formed as a single device by installing a data decoding program on the hard disk 13 of the data encoding device 1.

The CPU 11 of the data encoding device 1 operates according to a program stored in the hard disk 13 to perform data encoding, and so forth. This data encoding is described below in more detail. The memory 12 functions as a work memory of the CPU 11. The hard disk 13 stores a program to be executed by the CPU 11, parameter data, such as an encoding-table, for use in execution of the program by the CPU 11, and so forth. The display section 14 displays data on a display or the like in response to instructions from the CPU 11. The operation section 15 outputs a user's operation content to the CPU 11.

Respective sections of the data decoding device 2 operate in a similar manner, as instructed by a program stored in the hard disk 23, to perform data decoding, and so forth. This data decoding is described below in more detail. The memory 22 functions as a work memory of the CPU 21. The hard disk 23 stores a program to be executed by the CPU 21, parameter data, such as an encoding table, for use in execution of the program by the CPU 21, and so forth. The encoding table stored in the hard disk 23 is generally identical to that which is stored in the hard disk 13 of the data encoding device 1. The display section 24 displays data on a display or the like in response to instructions from the CPU 21. The operation section 25 outputs the content of a user operation to the CPU 21.

Encoding Table

The content of the encoding table stored in the hard disk 13 and the hard disk 23 will next be described.

The encoding table defines the correlation between a data element, or a unit of data encoding, and a code word. This embodiment is characterized in that two or more encoding tables are provided so as to respectively define different correlation with respect to one data element. This embodiment is also characterized in that two types of encoding tables are provided, one which uses a group of data resulting from classification of data, as a data element and is referred to in encoding which uses additional information, and another which uses the data itself as a data element and is referred to in normal encoding which does not use additional information.

Figure 2:
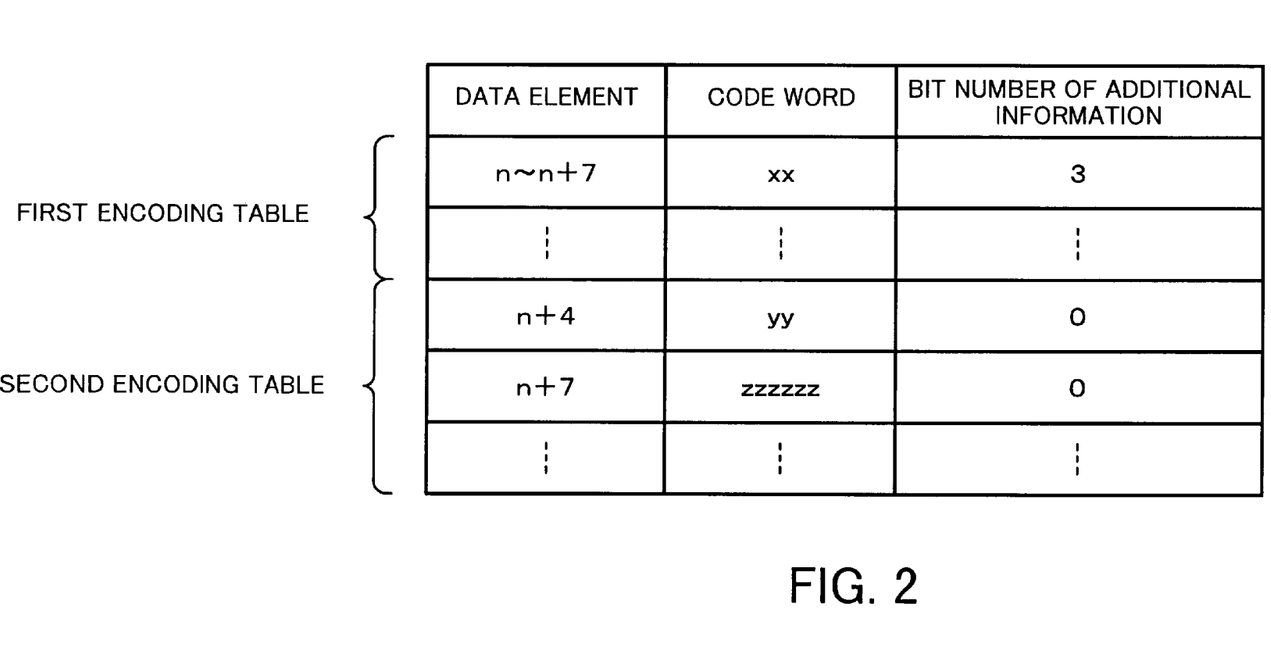
FIG. 2 is a diagram explaining an example of an encoding table employed in the embodiment.

That is, as shown in FIG. 2, the encoding table in this embodiment comprises a first encoding table which uses a group of data as a data element and a second encoding table which uses individual data as a data element. Although the first and second encoding tables are combined into a single table file in FIG. 2, these tables may be formed as separate table files for storage on a hard disk.

In the first encoding table of FIG. 2, data "to n+7" are grouped as one data element, and assigned code word "xx. In the second encoding table, data "n+4" is used as a data lement, and assigned code word "yy". In addition, in the first encoding table, the number of bits (three in the present example) which are necessary to describe additional information for discriminating the respective data which constitute a data group are allocated depending on the number of kinds of data included in the data group (eight here, i.e., data items included in "to n+7". In the second encoding table, no bit is allocated for additional information as additional information is unnecessary. It should be noted that three bits are allocated in the first encoding table of FIG. 2 because three bits are sufficient for defining eight data items.

Figure 3:
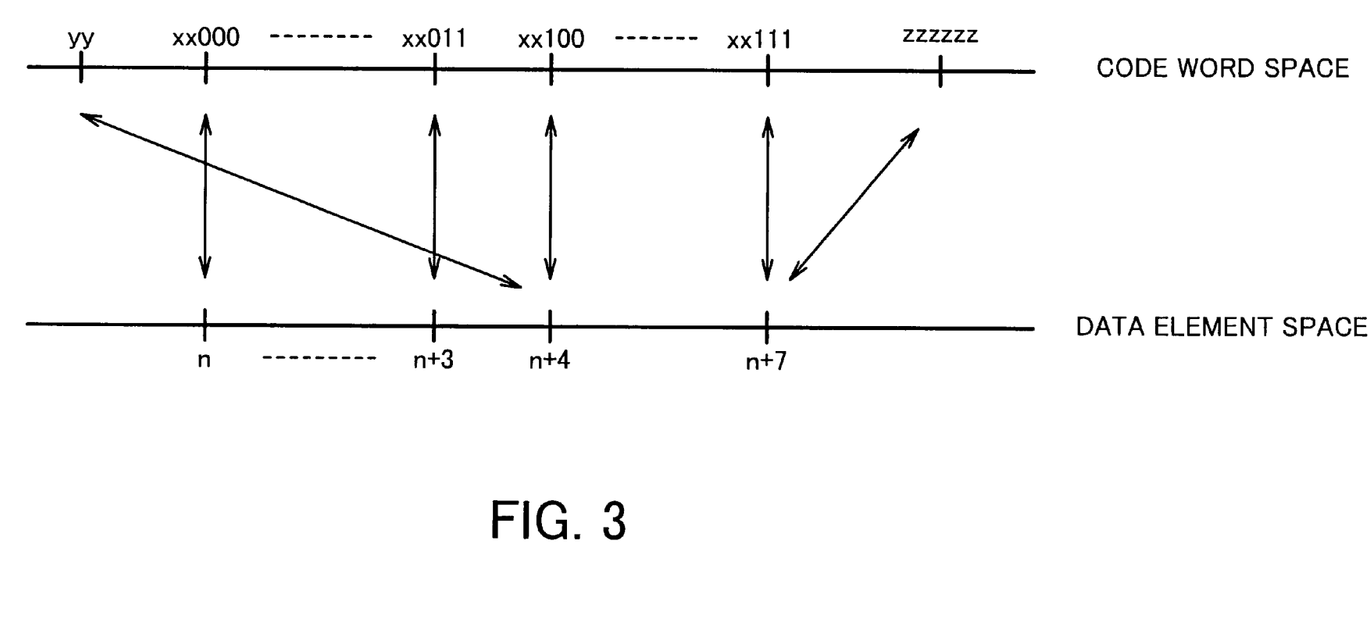
FIG. 3 is a diagram explaining correlation between code word space and data element space in the embodiment.

As described above, according to the encoding table in this embodiment, a function between an arithmetic space for data elements serving as a unit of encoding (a data element space) and an arithmetic space for code words (a code word space) is 1:N for an operation directing from respective elements in the data element space to those in the code word space, and N:1 for an operation vice versa, as can be seen in FIG. 3.

Encoding

Encoding by the CPU 11 of the data encoding device 1 will next be described.

Figure 4:
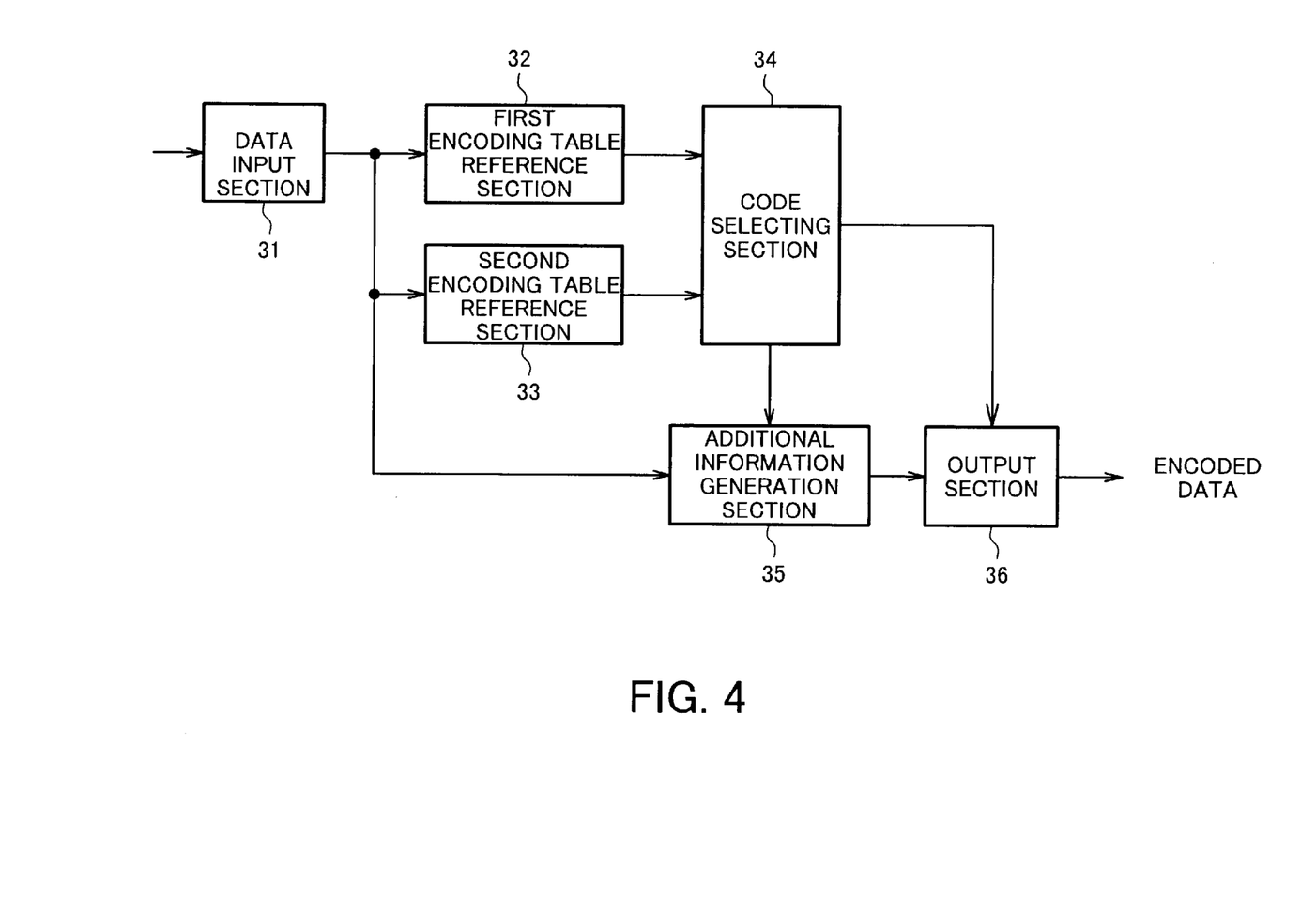
FIG. 4 is a functional block diagram for a data encoding program in the embodiment.

Functions of an encoding program to be executed by the CPU 11 can be schematically illustrated in the form of a functional block diagram, such as that shown in FIG. 4. That is, this encoding program realizes functions corresponding to a data input section 31, a first encoding table reference section 32, a second encoding table reference section 33, a code selecting section 34, an additional information generation section 35, and an output section 36. It should be noted that provision of the table reference section depends on the number of encoding tables stored in the hard disk 13. In the following, two encoding tables are provided as shown in FIG. 2.

The data input section 31 reads out a series of encoding data to hold in the memory 12, and sequentially out puts each of the encoding data to the first and second encoding table reference sections 32, 33. The data input section 31 also outputs the encoding data to the additional information generation section 35. The first encoding table reference section 32, while referring to a first encoding table stored in the hard disk 13, determines a data element corresponding to the received encoding data and then a group of data elements to which the determined data element belongs, and outputs a code word correlated with the determined data element group to the code selecting section 34.

Likewise, the second encoding table reference section 33 refers to a second encoding table stored in the hard disk 13 to determine a data element corresponding to the received encoding data and then a group of data elements to which the determined data element belongs, and outputs a code word correlated with the determined data element group to the code selecting section 34. These first and second encoding table reference sections 32, 33 constitute a search means of the present invention.

The code selecting section 34, which constitutes a selection means of the present invention, selects one of the code words supplied from the first and second encoding table reference sections 32, 33, according to a predetermined condition such as that a shorter code word should be first selected. The code selecting section 34 then outputs the selected code word to the additional information generation section 35 and the output section 36.

In the above example, the first and second encoding table reference sections 32, 33 both output code words. However, there may be cases, depending on the structure of the encoding table, wherein a code word correlated with a certain data element is present only in the first encoding table. In such a case, the second encoding table reference section 33 may output null data as it cannot provide any code word, so that the code selecting section 34 selects the code word output from the first encoding table reference section 32, disregarding the null data. That is, when the second encoding table reference section 33 outputs null data, the code selecting section 34 selects for output a code word output from the first encoding table reference section 32, as no other output is available.

Based on the received code word from the code selecting section 34 and encoding data from the data input section 31, the additional information generation section 35 determines whether or not additional information is necessary. If it is determined that additional information is required, the additional information generation section 35 creates additional information for output to the output section 36.

The output section 36 forwards the code word supplied from the code selection section 34 to a subsequent section, such as the hard disk 13, as encoded data. When the output section 36 also receives from the additional information generation section 35 additional information corresponding to the received code word, the output section 36 combines the received code word and additional information to create additional information attached encoded data, and outputs the data as encoded data. When no additional information is received, on the other hand, the output section 36 outputs normal encoded data which comprises the code word.

As described above, the CPU 11, which is responsible for execution of the data encoding program, initially receives via the operation section 15 a user command which instructs encoding the content of a data file stored in the hard disk 13, then reads out a series of encoding data from the data file and stores the data in the memory 12. Then, while sequentially extracting the encoding data from the memory 12, the CPU 11 determines a data element which corresponds to the extracted encoding data, and retrieves a code word correlated with the determined data element from the first and second encoding tables 32, 33 stored in the hard disk 13. Thereafter, the CPU 11 selects either one of the code words retrieved from the first and second code tables 32, 33 according to predetermined criteria, such as that a shorter code word should be first selected.

When the selected code word requires additional information (the first code word in the above example), the CPU 11 calculates additional information based on the code word and the original encoding data, and combines the code word and the additional information to form an additional information attached encoded data for output.

When, on the other hand, the selected code word does not require additional information (the second code word in the above example), the CPU 11 outputs the code word without modification as normal encoded data.

Subsequently, the CPU 11 determines if there is any encoding data left unprocessed. If any is found, the CPU 11 repeats the above processing, beginning by referring to the encoding table. If no unprocessed encoding data is found, the process is completed.

As described above, in this embodiment, encoded data generated by the data encoding device 1 generally includes additional information attached encoded data and normal encoded data.

Data Decoding Device

Processing according to a data decoding program as performed in this embodiment by the data decoding device 2 will next be described.

Figure 5:
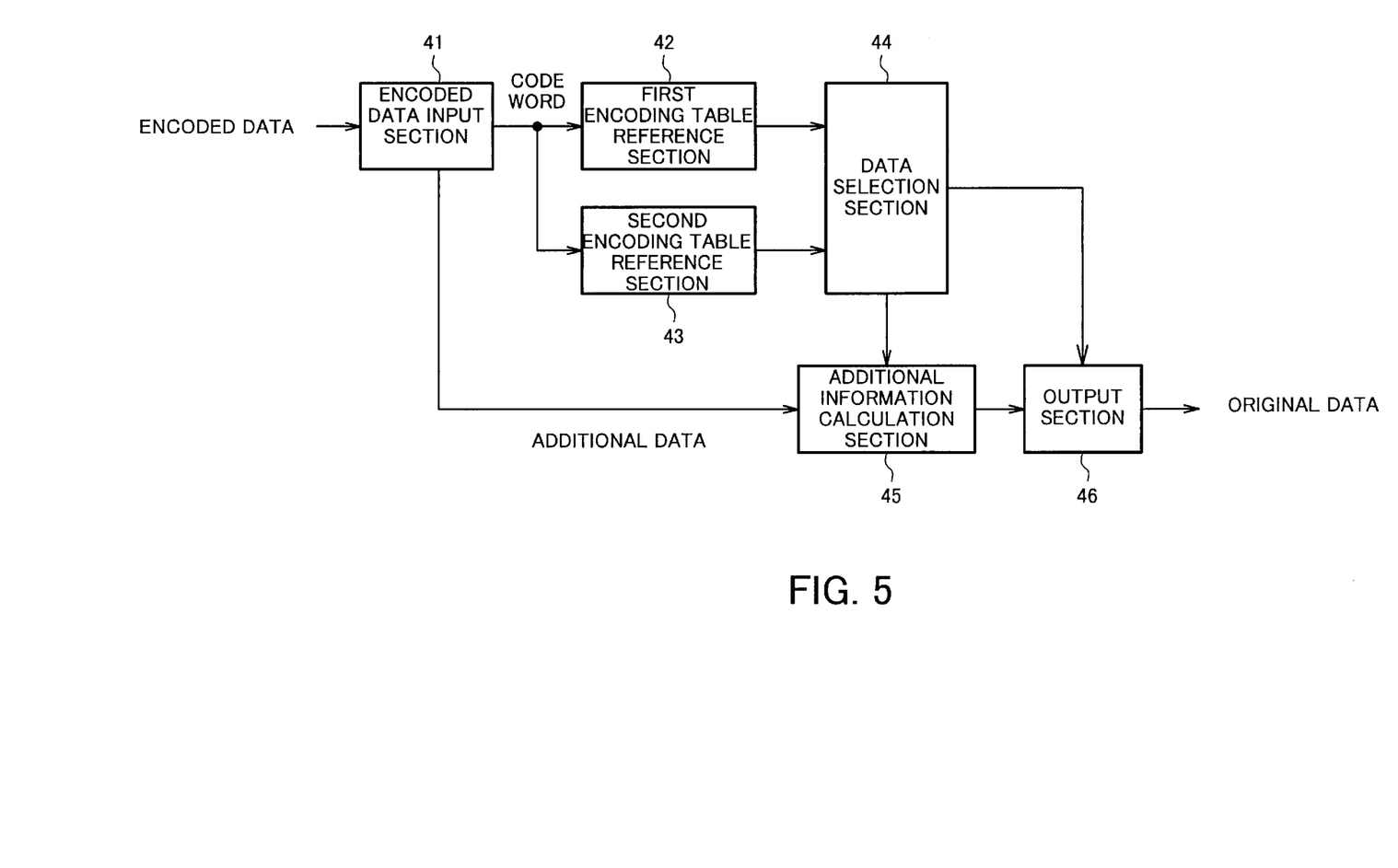
FIG. 5 is a functional block diagram for a data decoding program in the embodiment.

A data decoding program in this embodiment realizes functions corresponding to an encoded data input section 41, a first encoding table reference section 42, a second encoding table reference section 43, a data selection section 44, an additional information calculation section 45, and an output section 46, as shown in FIG. 5. It should be noted that provision of the table reference section depends on the number of encoding tables stored in the hard disk 23. In the following example, two encoding tables are provided as shown in FIG. 2.

The encoded data input section 41 reads out a series of encoded data to store in the memory 22, and extracts a code word from each of the encoded data to output to the first and second encoding table reference sections 42, 43. When the encoded data contains additional information, the encoded data input section 41 outputs the additional information to the additional information calculation section 45.

The first encoding table reference section 42, while referring to the first encoding table stored in the hard disk 23, searches for the code word supplied from the encoded data input section 41. When the code word is defined in the first encoding table, the first encoding table reference section 42 outputs a data element which is defined as correlated with the code word to the data selection section 44. When the code word is not defined, on the other hand, the first encoding table reference section 42 outputs predetermined null data to the data selection section 44.

Likewise, the second encoding table reference section 43 refers to the second encoding table stored in the hard disk 23 to search for the code word supplied from the encoded data input section 41. When the code word is defined in the second encoding table, the second encoding table reference section 43 outputs a data element which is defined as correlated with the code word to the data selection section 44. When the code word is not defined, the second encoding table reference section 43 outputs predetermined null data to the data selection section 44.

The data selection section 44 selects one of the data elements supplied from the first and second encoding table reference sections 42, 43, which is not null data, and outputs the selected data element to the additional information calculation section 45.

Note that two or more data which are not null, or an effective data element, may be output from these encoding table reference sections depending on the structure of the encoding table. All of such data elements, however, should be the same because an encoding table defines one data element relative to one code word. Therefore, the data selection section 44 may select any of the received effective data elements in a desired manner, for example, in a first-in-first-out method or according to priority numbers assigned in advance to the respective encoding tables, and so forth, to output.

The additional information calculation section 45 receives and holds a data element from the data selection section 44. In the case where the additional information calculation section 45 receives also additional information from the encoded data input section 41, the additional information calculation section 45 reproduces data before encoding (encoding data) based on the received data element and additional information, and outputs the resultant data to the output section 46. In the case where no additional information is received, on the other hand, the additional information calculation section 45 outputs the data element received from the data selection section 44 and held therein without modification as data before encoding (encoding data) to the output section 46. The output section 46 forwards the received data from the additional information calculation section 45 to a predetermined section, such as a hard disk 23.

As described above, the CPU 21, which is responsible for execution of the data decoding program, initially receives a command via the operation section 25, which instructs decoding of a series of encoded data in an encoded data file to restore the original data file, then reads out a series of encoded data from the encoded data file, and stores them in the memory 22. Then, while sequentially retrieving each of the encoded data from the series of the encoded data, the CPU 21 extracts a code word from the extracted encoded data, or target encoded data. When the target encoded data contains additional information, the additional information is held in the CPU 21.

Thereafter, the CPU 21, while referring to the first encoding table stored in the hard disk 23, searches for the extracted code word. In a case wherein the code word is defined in the first encoding table, in other words, when the first encoding table defines a correlation between that code word and a data element, the CPU 21 holds the correlated data element as a first candidate. In the case where the code word is not defined in the first encoding table, the CPU 21 holds null data as a first candidate.

Likewise, the CPU 21 refers to the second encoding table stored in the hard disk 23 to search for the extracted code word. In a case wherein the code word is defined in the second encoding table, in other words, when the second encoding table defines a correlation between that code word and a data element, the CPU 21 holds the correlated data element as a second candidate. However, when the code word is not defined in the second encoding table, the CPU 21 holds null data as a second candidate.

Subsequently, the CPU 21 selects one of the first and second candidates, which is not null data, as an effective data element. When the target encoded data contains additional information and the CPU 21 holds that additional information, the CPU 21 reproduces the original data based on the additional information and the effective data element, and writes the reproduced original data onto the hard disk 23. When the target encoded data does not contain additional information and the CPU 21 does not hold that additional information, on the other hand, the CPU 21 writes the effective data element without modification as original data onto the hard disk 23.

Then, the CPU 21 determines if there is any encoded data left unprocessed. If any unprocessed data is found, the CPU 21 repeats the above processing relative to that encoded data which is then used as target encoded data. If no unprocessed is found, the process is completed.

As described above, data before encoding (a data file containing a series of encoding data) is reproduced and stored in the hard disk 23.

Operation

Operation of the data encoding device 1 and of the data decoding device 2 in a data processing system will be separately described. In this embodiment, the hard disk 13 of the data encoding device 1 and the hard disk 23 of the data decoding device 2 both store the encoding table shown in FIG. 2.

Initially, operation of the data encoding device 1 will be described.

When a series of encoding data, for example, "n "n+4 "n+7" are input, the data encoding device 1 initially conducts a search relative to "n" in the first and second encoding tables. Specifically, the data encoding device 1, while referring to the first encoding table, determines that "n" is included in a data element group "to n+7", and obtains a code word correlated with the data element "to n+7", namely, "xx". Then, the data encoding device 1 refers to the second encoding table and, as it determines that no code word is defined as correlated with the encoding data "n" itself, obtains null data. Therefore, encoding data "n" is encoded (converted) into a code word "xx".

Subsequently, additional information, for example, "000" is generated. Additional information enables specification of a particular kind of data element among two or more kinds of data elements which belong to the group correlated with the code word "xx". The generated additional information is attached to the code word whereby encoded data "xx000 is formed. Encoded data "xx000" is written onto the hard disk 13.

Likewise, as for encoding data "n+4", code word" is obtained from the first encoding table, and code word "yy" is obtained from the second encoding table. It is known from reference to the first encoding table that code word "xx" requires three bits for additional information, and from reference to the second encoding table that code word "yy" requires no bits for additional information. Therefore, additional information attached encoded data "xx100" and normal encoded data "yy" result. When encoding according to a predetermined criteria, such as that a shorter code word should be selected first, "yy" is selected. That is, encoding data "n+4 is encoded into encoded data "yy". The encoded data "yy" is written in addition to the encoded data "xx000 onto the hard disk 13.

Further likewise, for encoding data "n+7" encoded data of five bits, namely "xx111", being a combination of code word "xx" and additional information "111", is obtained with reference to the first encoding table, while a code word of six bits, namely "zzzzzz", is obtained with reference to the second encoding table. Therefore, encoding data "n+7" is encoded into "xx111".

Throughout the above processing, an encoded data file which contains encoded data "xx000", "yy", "xx111" is stored in the hard disk 13.

For decoding by the data decoding device 2, the respective encoded data are searched for in the first and second encoding tables 42, 43.

Initially, encoded data "xx000" is divided into code word" and additional information "000", and a data element correlate with the code word "xx", namely "to n+7", is determined from the first encoding table. Null data is then obtained from the second encoding table. Then, based on the determined data element and the additional information, data before encoding (encoding data) "n" is reproduced. The reproduced data "n" is written onto the hard disk 23.

Then, for encoded data "yy which consists of just the code word "yy", a correlated data element, namely "n+4", is determined from the second encoding table, and written without modification as original data into the hard disk 23. Encoded data "xx111" is similarly processed to reproduce data before encoding "n+7".

As described above, data before encoding (encoding data) "n", "n+4", "n+7" are reproduced, and stored in the hard disk 23.

Although in the above-described encoding the code selecting section 34 of the data encoding device 1 first selects a shorter code word, a code word may also be selected according to priority numbers which are attached in advance to the respective encoding tables. This arrangement can eliminate comparison of code lengths, improving processing efficiency. When this arrangement is employed, deterioration of a compression rate can be avoided by determining in advance such that an encoding table which defines the shortest code word relative to a data element should be first selected.

As described above, in this embodiment a single data element may correlate with two or more code words. This makes it possible to perform encoding and decoding using a smaller table employing additional bits, while maintaining a high compression rate, regardless of the distribution of appearance frequencies of the data elements. A smaller table can be more easily installed.

Inclusion of Selection Information

In the above-described decoding, a code word to be decoded is searched for in respective encoding tables so that either one of the data elements which are determined as correlated with the code word is selected. Alternatively, selection information indicative of an encoding table which was referred to in encoding may be output so as to be correlated with each code word, so that an encoding table to be referred to in searching for a concerned code word for decoding can be determined with reference to the selection information.

With such a configuration, in an example data encoding program according to the present invention, the code selecting section 34 outputs selection information for specifying an encoding table corresponding to the selected code word to the output section 36, so that the output section 36 outputs encoding data (either additional information attached encoded data or normal encoded data) so as to be correlated with the selection information. Therefore, resultant encoded data contains a pair of encoded data and selection information.

Further, according to the data decoding program, the encoded data input section 41 outputs a code word which is contained in target encoded data, selectively to either the first or second encoding table reference section 42 or 43 based on the selection information which is correlated with the target encoded data. Then, one of the first and second encoding table reference sections 42 which receives the code word outputs a data element which is defined as correlated with the received code word to the data selection section 44. The data selection section 44 then simply forwards the received data element without modification to the additional information calculation section 45, and therefore may be omitted. That is, this arrangement can simplify a structure of the program by eliminating the data selection section 44, so that the program can be easily installed.

Note that, in this case, arrangement must be made so as to ensure conformity in interpretation of selection information by the code selecting section 34 and the encoded data input section 41. This arrangement can be attained by employing, for example, binary selection information and predetermining such that data 0 indicates selection of a code word from the first encoding table and that data 1 indicates selection from the second encoding table.

Other Conditions for Code Word Selection

In the above, the code selecting section 34 selects a code word according to a code length or a predetermined order of priority. Alternatively, a command (side information) telling which code word to select may be externally supplied for every data element, so that the code selecting section 34 may select a code word based on this information. When this is done, the side information must be usable also in decoding. Therefore, the side information must be included in the selection information or separately held so as to be referred to by the data selection section 44 during decoding.

Because in such a case a compression rate may vary depending on the side information, to avoid a significant drop of a compression rate, the code words assigned to the data must have similar lengths.

What is claimed is:

1. A data encoding device, comprising:
   an encoding table for correlating a data element with a code word such that one data element is correlated with N number of code words and one code word is correlated with one data element, the data element serving as a unit of data encoding, N being an integer larger than zero;
   a retrieve unit for determining a data element corresponding to each of a series of encoding data and for retrieving the N number of code words correlated with the determined data element with reference to the encoding table;
   a selector for selecting one code word from among the N number of code words according to predetermined criteria; and
   a generator means for generating, as required, additional information which specifies encoding data correlated with the selected code word among one or more encoding data corresponding to the determined data element correlated with the selected code word,
   whereby
      each encoding data is converted into either additional information attached encoded data or normal encoded data, the additional information attached encoded data consisting of a code word and additional information, the normal encoded data consisting of a code word.

2. The data encoding device according to claim 1, wherein the selector selects the shortest code word from among the N number of code words as defined as the predetermined criteria.

3. The data encoding device according to claim 1, wherein the selector selects one code word according to a predetermined priority order as defined as the predetermined criteria.

4. A data encoding device, comprising:
   encoding tables each for correlating one data element with one code word, the data element serving as a unit of data encoding;
   a retrieve unit for determining a data element corresponding to each of a series of encoding data and for retrieving N number of encoding tables which each define a code word correlated with the determined data element, N being an integer larger than zero;
   a selector for selecting one encoding table from among the N number of encoding tables according to a predetermined criteria to output a code word which is defined by the selected encoding table as correlated with the determined data element;
   a generator for generating, as required, additional information which specifies encoding data correlated with the selected code word among one or more encoding data corresponding to the determined data element correlated with the selected code word,
   whereby
      each encoding data is converted into either additional information attached encoded data or normal encoded data, the additional information attached encoded data consisting of a code word and additional information, the normal encoded data consisting of a code word.

5. The data encoding device according to claim 4, wherein the selector selects an encoding table which correlates the data element with the shortest code word from among the N number of encoding tables as defined as the predetermined criteria.

6. The data encoding device according to claim 4, wherein the selector selects one encoding table according to a predetermined priority order as defined as the predetermined criteria.

7. The data encoding device according to claim 4, wherein the selector outputs selection information specifying the selected encoding table for correlation with each code word.

8. A data decoding device, comprising:
   an encoding table for correlating a data element with a code word such that one data element is correlated with N number of code words and one code word is correlated with one data element, the data element serving as a unit of data encoding, N being an integer larger than zero;
   a retrieve unit for sequentially extracting encoded data from a series of encoded data obtained by a data encoding device and for retrieving a data element correlated with a code word contained in the extracted encoded data with reference to the encoding table; and
   a decoder for decoding, when the extracted encoded data is additional information attached encoded data, additional information based on the retrieved data element and the extracted additional information.

9. A data decoding device, comprising:
   encoding tables each for correlating one data element with a code word, the data element serving as a unit of data encoding;
   a retrieve unit for sequentially extracting encoded data from a series of encoded data obtained by a data encoding device and for retrieving a data element correlated with a code word contained in the extracted encoded data with reference to one of the encoding tables; and
   a decoder for decoding, when the extracted encoded data is additional information attached encoded data, additional information based on the retrieved data element and the extracted additional information.

10. A data decoding device, comprising:
    encoding tables each for correlating one data element with a code word, the data element serving as a unit of data encoding;
    a retrieve unit for sequentially extracting encoded data from a series of encoded data obtained by a data encoding device to extract a code word contained in the extracted encoded data, for selecting one encoding table from among the encoding tables based on selection information which is correlated with the extracted code word, and for retrieving a data element correlated with the extracted code word with reference to the selected encoding table; and
    a decoder for decoding, when the extracted encoded data is additional information attached encoded data, additional information based on the determined data element and the extracted additional information.

11. A data encoding method employing an encoding table which correlates a data element with a code word such that one data element is correlated with N number of code words and one code word is correlated with one data element, the data element serving as a unit of data encoding, N being an integer larger than zero; the method, comprising:

a search step of determining a data element corresponding to each of a series of encoding data to determine the N number of code words correlated with the determined data element with reference to the encoding table;

a selection step of selecting one code word from among the N number of code words according to a predetermined criteria; and a generation step of generating, as required, additional information which specifies encoding data correlated with the selected code word among one or more encoding data corresponding to the determined data element correlated with the selected code word, whereby each encoding data is converted into either additional information attached encoded data or normal encoded data, the additional information attached encoded data consisting of a code word and additional information, the normal encoded data consisting of a code word.

12. A data decoding method employing a table which correlates a data element with a code word such that one data element is correlated with N number of code words and one code word is correlated with one data element, the data element serving as a unit of data encoding, N being an integer larger than zero, the method, comprising:

a search step of sequentially extracting encoded data from a series of encoded data obtained by a data encoding device and determining a data element correlated with a code word contained in the extracted encoded data with reference to the table; and a decoding step of decoding, when the extracted encoded data is additional information attached encoded data, additional information based on the determined data element and the extracted additional information.

13. Encoded data, generated using an encoding table which correlates a data element with a code word such that one data element is correlated with N number of code words and one code word is correlated with one data element, the data element serving as a unit of data encoding, N being an integer larger than zero, as the product of:

a search step of determining a data element corresponding to each of a series of encoding data and for determining the N number of code words correlated with the determined data element with reference to the encoding table;

a selection step of selecting one code word from among the N number of code words according to a predetermined criteria; and a generation step of generating, as required, additional information which specifies encoding data correlated with the selected code word among one or more encoding data corresponding to the determined data element correlated with the selected code word, to thereby convert each encoding data into either additional information attached encoded data or normal encoded data, the additional information attached encoded data consisting of a code word and additional information, the normal encoded data consisting of a code word, wherein the encoded data contains at least one of the additional information attached encoded data and the normal encoded data based on the series of encoding data.

14. Encoded data generated by encoding a series of encoding data, including additional information attached encoded data and normal encoded data, the additional information attached encoded data consisting of a code word and additional information and the word data consisting of a code word.

15. Encoded data, generated using two or more encoding tables which respectively correlate one data element with different code words, the data element serving as a unit of data encoding, as the product of:

a search step of determining a data element corresponding to each of a series of encoding data and determining N number of encoding tables which each define a code word correlated with the determined data element, N being an integer larger than zero;

a selection step of selecting one encoding table from among the N number of encoding tables according to predetermined criteria to output a code word correlated with the determined data element according to the selected encoding table;

a generation step of generating, as required, additional information which specifies encoding data correlated with the selected code word among one or more encoding data corresponding to the determined data element correlated with the selected code word, to thereby convert each encoding data into either additional information attached encoded data or normal encoded data, the additional information attached encoded data consisting of a code word and additional information, the normal encoded data consisting of a code word, wherein the encoded data contains at least one additional information attached encoded data and one normal encoded data according to the series of encoding data.

16. Encoded data according to claim 15, further containing information specifying an encoding table which is selected when outputting each code word.

17. A storage medium storing a data encoding program which employs an encoding table which correlates a data element with a code word such that one data element is correlated with N number of code words and one code word is correlated with one data element, the data element serving as a unit of data encoding, N being an integer larger than zero, and which, when executed, causes a computer to execute:

a search step of determining a data element corresponding to each of a series of encoding data and determining the N number of code words correlated with the determined data element with reference to the encoding table;

a selection step of selecting one code word from among the N number of code words according to a predetermined criteria; and a generation step of generating, as required, additional information which specifies encoding data correlated with the selected code word among one or more encoding data corresponding to the determined data element correlated with the selected code word, to thereby convert encoding data into either additional information attached encoded data or normal encoded data, the additional information attached encoded data consisting of a code word and additional information, the normal encoded data consisting of a code word.

18. A storage medium storing a data decoding program which employs an encoding table which correlates a data element with a code word such that one data element is correlated with N number of code words and one code word is correlated with one data element, the data element serving as a unit of data encoding, N being an integer larger than zero, and which, when executed, causes a computer to execute:

a search step of sequentially extracting encoded data from a series of encoded data obtained through encoding according to a data encoding program and determining a data element correlated with a code word contained in the extracted encoded data with reference to the encoding table, the data encoding program employing an encoding table which correlates a data element with a code word such that one data element is correlated with N number of code words and one code word is correlated with one data element, the data element serving as a unit of data encoding, N being an integer larger than zero, and causing a computer to execute a search step of determining a data element corresponding to each of a series of encoding data to determine the N number of code words correlated with the determined data element with reference to the encoding table; a selection step of selecting one code word from among the N number of code words according to a predetermined criteria; and a generation step of generating, as required, additional information which specifies encoding data correlated with the selected code word among one or more encoding data corresponding to the determined data element correlated with the selected code word, to thereby convert encoding data into either additional information attached encoded data or normal encoded data, the additional information attached encoded data consisting of a code word and additional information, the normal encoded data consisting of a code word; and a decoding step of extracting, when the extracted encoded data is additional information attached encoded data, additional information from the extracted encoded data to restore data before encoding based on the determined data element and the extracted additional information.

* * * * *